United States Patent [19]
Farnworth et al.

[11] Patent Number: 6,130,148
[45] Date of Patent: Oct. 10, 2000

[54] INTERCONNECT FOR SEMICONDUCTOR COMPONENTS AND METHOD OF FABRICATION

[76] Inventors: Warren M. Farnworth, 2004 S. Banner, Nampa, Id. 83686; Salman Akram, 1463 E. Regatta St., Boise, Id. 83706

[21] Appl. No.: 08/989,444

[22] Filed: Dec. 12, 1997

[51] Int. Cl.⁷ .................................................. H01L 21/44
[52] U.S. Cl. ........................... 438/613; 438/612; 438/614
[58] Field of Search .................................... 438/612, 613, 438/614, 615

[56] References Cited

U.S. PATENT DOCUMENTS

| | | | |
|---|---|---|---|
| 5,302,891 | 4/1994 | Wood et al. | 324/158 F |
| 5,393,697 | 2/1995 | Chang et al. | 438/614 |
| 5,419,807 | 5/1995 | Akram et al. | 438/14 |
| 5,483,741 | 1/1996 | Akram et al. | 29/846 |
| 5,495,179 | 2/1996 | Wood et al. | 324/755 |
| 5,508,228 | 4/1996 | Nolan et al. | 438/614 |
| 5,519,332 | 5/1996 | Wood et al. | 324/755 |
| 5,523,697 | 6/1996 | Farnworth et al. | 324/758 |
| 5,541,525 | 7/1996 | Wood et al. | 324/755 |
| 5,585,282 | 12/1996 | Wood et al. | 437/8 |
| 5,592,736 | 1/1997 | Akram et al. | 29/842 |
| 5,607,818 | 3/1997 | Akram et al. | 430/311 |
| 5,633,122 | 5/1997 | Tuttle | 430/317 |
| 5,678,301 | 10/1997 | Gochnour et al. | . |
| 5,686,317 | 11/1997 | Akram et al. | 437/8 |
| 5,691,649 | 11/1997 | Farnworth et al. | 324/755 |
| 5,707,902 | 1/1998 | Chang et al. | 438/614 |
| 5,716,218 | 2/1998 | Farnworth et al. | . |
| 5,789,271 | 8/1998 | Akram | . |
| 5,808,360 | 9/1998 | Akram | . |
| 5,815,000 | 9/1998 | Farnworth et al. | . |
| 5,834,366 | 11/1998 | Akram | . |
| 5,834,945 | 11/1998 | Akram et al. | . |
| 5,869,974 | 2/1999 | Akram et al. | . |
| 5,878,485 | 3/1999 | Wood et al. | . |
| 5,894,161 | 4/1999 | Akram et al. | 257/48 |
| 5,904,546 | 5/1999 | Wood et al. | 438/460 |
| 5,915,755 | 6/1999 | Gochnour et al. | . |
| 5,915,977 | 6/1999 | Hembree et al. | . |
| 5,929,647 | 7/1999 | Akram et al. | . |
| 5,931,685 | 8/1999 | Hembree et al. | . |
| 5,952,840 | 9/1999 | Farnworth et al. | . |
| 5,962,921 | 10/1999 | Farnworth et al. | . |
| 5,982,185 | 11/1999 | Farnworth | . |
| 6,002,180 | 12/1999 | Akram et al. | . |
| 6,005,288 | 12/1999 | Farnworth et al. | . |
| 6,016,060 | 1/2000 | Akram et al. | . |
| 6,018,249 | 1/2000 | Akram et al. | . |
| 6,025,730 | 2/2000 | Akram et al. | . |
| 6,025,731 | 2/2000 | Hembree et al. | . |
| 6,040,239 | 3/2000 | Akram et al. | . |
| 6,040,702 | 3/2000 | Hembree et al. | . |

OTHER PUBLICATIONS

Lorenz H. et al., "Suss report", brochure, vol. 10, Third/Fourth Quarter 1996.

*Primary Examiner*—Kevin M. Picardat
*Attorney, Agent, or Firm*—Stephen A. Gratton

[57] ABSTRACT

An interconnect for electrically contacting semiconductor components such as bare dice, wafers and chip scale packages, is provided. The interconnect includes a rigid substrate and polymer contact members formed on the substrate. The polymer contact members are adapted to electrically engage contacts (e.g., bond pads, solder bumps) on the component. In one embodiment the polymer contact members are raised members with penetrating projections covered with conductive layers. In another embodiment the polymer contact members are indentations and penetrating projections covered with conductive layers. A method for fabricating the polymer contact members includes the steps of depositing, patterning and etching a thick film resist. These steps are followed by electrolessly depositing conductive layers on the contact members, and conductors in electrical communication with the conductive layers.

21 Claims, 4 Drawing Sheets

INTERCONNECT FOR SEMICONDUCTOR COMPONENTS AND METHOD OF FABRICATION

FIELD OF THE INVENTION

This invention relates generally to semiconductor manufacture and more particularly to an interconnect for making electrical connections with semiconductor components.

BACKGROUND OF THE INVENTION

Semiconductor dice are used in the construction of electronic components, such as multi chip modules. For example, bare semiconductor dice can be mounted to substrates formed of ceramic and FR-4 materials. Flip chip mounting of bumped dice is one method for electrically connecting the dice to the substrates. With flip chip mounting, solder bumps on the device bond pads are reflowed into electrical contact with contacts on the substrate. Chip on board (COB) mounting of dice to substrates can also be employed. With chip on board mounting, wire bonds are formed between the device bond pads and contacts on the substrate. TAB mounting is another mounting method. With TAB mounting, electrical connections are made to the device bond pads, using a multi layer tape comprising a polymer backing with patterns of conductors.

Chip scale packages are sometimes used in place of bare dice for fabricating electronic components. Typically, a chip scale package includes a substrate bonded to the face of a bare die. The substrate includes the external contacts for making outside electrical connections to the chip scale package. The substrate for a chip scale package can comprise a flexible material, such as a polymer tape, or a rigid material, such as silicon, ceramic, glass or FR-4. The external contacts for one type of chip scale package include solder balls arranged in a dense array, such as a ball grid array (BGA), or a fine ball grid array (FBGA). In general, chip scale packages can be mounted to substrates using the same mounting methods employed with bare dice (e.g., flip chip, COB, TAB).

Besides making permanent electrical connections to bare dice and chip scale packages for fabricating electronic components, electrical connections are sometimes necessary for testing applications. For example, bare dice are tested in the manufacture of known good die (KGD). Chip scale packages must also be tested prior to use in electronic components. In these cases the electrical connections with the device bond pads for bare dice, or with external contacts for chip scale packages, are preferably non-bonded, temporary electrical connections. In addition to being temporary, the electrical connections must have a low contact resistance, and preferably cause minimal damage to the device bond pads or external contacts.

The present invention is directed to an improved interconnect for making electrical connections with semiconductor components including dice and chip scale packages.

SUMMARY OF THE INVENTION

In accordance with the present invention, an improved interconnect for semiconductor components, such as dice, wafers and chip scale packages, and a method for fabricating the interconnect are provided. Also provided are improved test systems employing the interconnect.

The interconnect includes a substrate, and polymer contact members formed on the substrate, adapted to electrically engage contacts on the components. The polymer contact members also include conductive layers in electrical communication with conductors formed on the substrate.

The substrate comprises a rigid material such as ceramic, amorphous silicon, polycrystalline silicon, monocrystalline silicon, or a glass filled resin. The polymer contact members comprise a thick film resist, which is deposited on the substrate, photopatterned, etched, and then cured. One suitable thick film resist is a negative tone resist comprising an epoxy resin, an organic solvent, and a photo initiator. The thick film resist is capable of forming contact members with a high aspect ratio, in which a height, or depth, of the contact members is much greater than a width, or diameter, of the contact members. The conductive layers for the contact members comprise a metal, such as nickel, palladium, or platinum, deposited with a low temperature process, such as electrolyses deposition or electrochemical deposition.

In an illustrative embodiment, the polymer contact members are raised members with penetrating projections adapted to penetrate contacts on the components to a limited penetration depth. In this embodiment, the contact members can be used to electrically contact either planar contacts (e.g., bond pads) on the components, or to electrically contact bumped contacts (e.g., solder balls) on the components. In an alternate embodiment, the polymer contact members are indentations adapted to retain and electrically engage bumped contacts on the components. In this embodiment, penetrating projections with a high aspect ratio can be formed in the indentations for penetrating the bumped contacts.

The method for fabricating the interconnect includes the steps of: providing a substrate; depositing a thick film polymer layer on the substrate; patterning the polymer layer; etching the polymer layer to form contact members; curing the polymer layer to harden the contact members; forming conductive layers on the contact members; and then forming conductors on the substrate in electrical communication with the contact members.

DETAILED DESCRIPTION OF THE PREFERRED EMBODIMENTS

Figure 1A:
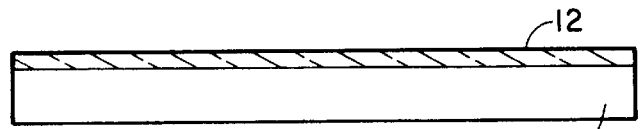
FIGS. 1A–1F are schematic cross sectional views illustrating process steps in a method for fabricating an interconnect with polymer contact members in accordance with the invention.

Referring to FIGS. 1A–1F, steps in a method for fabricating an interconnect in accordance with the invention are illustrated. Initially, as shown in FIG. 1A, a substrate 10 is provided. The substrate 10 is preferably a rigid material having a coefficient of thermal expansion (CE) that is similar to a CE for silicon. Preferred materials for the substrate 10 include ceramic, mullite, amorphous silicon, polycrystalline silicon, single crystal silicon, and glass filled resins (e.g., FR-4).

As also shown in FIG. 1A, an insulating layer 12 can be formed on the substrate 10. The insulating layer 12 provides electrical insulation for electrical elements to be subsequently formed on the substrate 10. In addition, the insulating layer 12 provides an endpoint, or etch stop, for a subsequent etching step. The insulating layer 12 can comprise a layer of resist, blanket deposited on the substrate 10 and then cured. Alternately, the insulating layer 12 can comprise a polymer material, such as polyimide, spun-on or otherwise deposited on the substrate 10. Still further, the insulating layer 12 can comprise a deposited, or grown, oxide or nitride. A representative thickness for the insulating layer 12 is from several hundred Å to several mils or more.

Figure 1B:
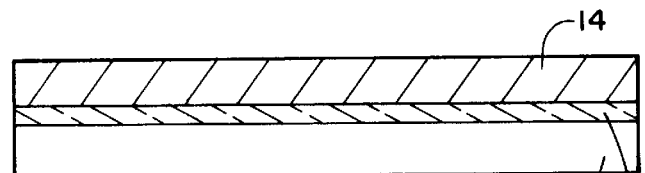

Next as shown in FIG. 1B, a polymer layer 14 is formed on the insulating layer 12. One suitable polymer for forming the polymer layer 14 is a negative tone, thick film resist sold by Shell Chemical under the trademark "EPON RESIN SU-8". The resist also includes an organic solvent (e.g., gamma-butyloracton), and a photoinitiator. The resist can be deposited to a thickness of from about 3–50 mils. In addition, the resist can be etched (i.e., developed) with high aspect ratio features having almost vertical sidewalls. The term "high aspect ratio" means that a height, or depth, of the features is large in comparison to a width, or diameter, of the features. The above resist can be used to form features having aspect ratios (e.g., height/width) of 10 or more. For example, for raised features (e.g., lines) aspect ratios of 15 can be achieved. For indented features (e.g., trenches) aspect ratios of 10 can be achieved.

A conventional resist coating apparatus, such as a spin coater, or a meniscus coater, can be used to deposit the resist onto the insulating layer 12. The deposited resist can then be "prebaked" at about 95° C. for about 15 minutes. The prebaking step partially hardens the polymer layer for subsequent processes.

Figure 1C:
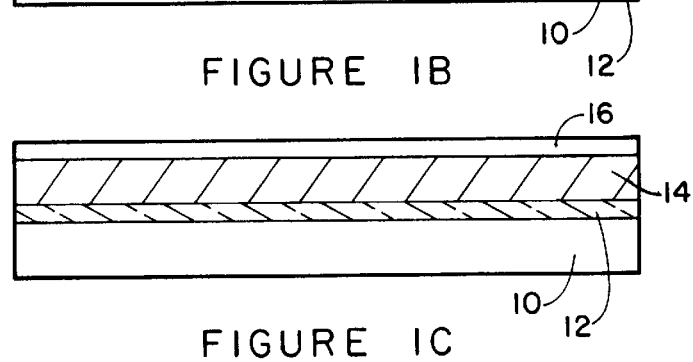

Next, as shown in FIG. 1C, a mask 16 can be formed on the polymer layer 14 using conventional mask fabrication techniques. For example, the mask 16 can comprise a material such as a nitride, deposited to a desired thickness using a suitable deposition process (e.g., CVD), and then patterned using an exposed and developed resist layer (not shown).

Figure 1D:
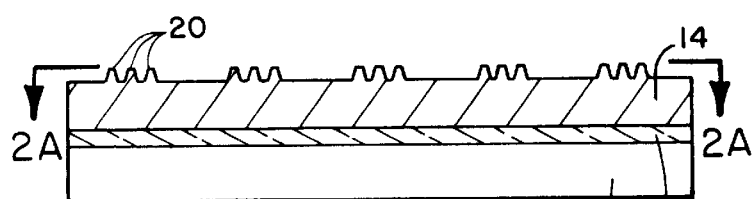

Next, as shown in FIG. 1D, the mask 16 can be used to etch the polymer layer 14 to form patterns of projections 20. The projections 20 are subjacent to solid portions of the mask 16. Unprotected areas of the polymer layer 14 surrounding the projections 20 have been etched away. A depth of the etch corresponds to a height of the projections 20. The projections 20 are configured to penetrate contacts 22 (FIG. 3) on a semiconductor component 24. One suitable wet etchant for etching the above resist formulation is a solution of PGMEA (propyleneglycol-monomethylether-acetate). Another suitable wet etchant is a hot (e.g., 105° C.) solution of n-methyl-2-pyrrolidone.

Figure 2A:
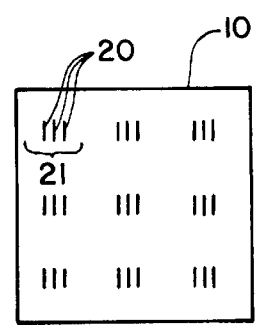
FIG. 2A is a schematic plan view taken along section line 2A—2A of FIG. 1D.
Figure 3:
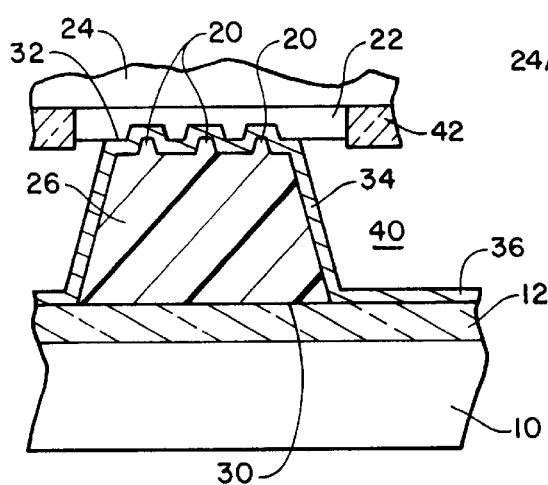
FIG. 3 is an enlarged schematic cross sectional view taken along section line 3—3 of FIG. 1F illustrating a contact member on the interconnect in electrical communication with a contact on a semiconductor component.

As shown in FIG. 2A, the projections 20 can be formed in patterns 21. Each separate pattern 21 is contained within the outer peripheral dimensions of contacts 22 (FIG. 3) on a semiconductor component 24 (FIG. 3). For example, with the contacts 22 comprising bond pads, each pattern 21 of projections 20 will be contained within a peripheral area of the bond pad (e.g., 100 μm×100 μm). In the illustrative embodiment there are three parallel, spaced projections per contact 22. However, other patterns can also be used (e.g., cross, circular, nested). A height of the projections 20 is selected to be less than a thickness of the contacts 22. With the contacts 22 comprising thin film bond pads having a thickness of about 1–1.5 μm, a representative height for the projections 20 can be from 2000 Å to 8000 Å. Following the etch process for forming the projections 20, the mask 16 can be removed using another wet etchant. For a mask 16 formed of a nitride (e.g., $Si_3N_4$) a suitable etchant is $H_3PO_4$.

Figure 1E:
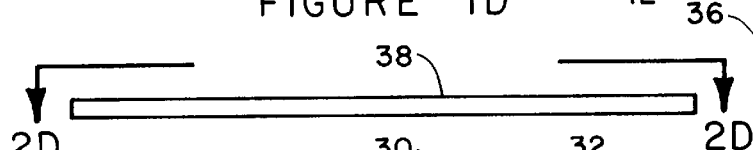
Figure 1E:
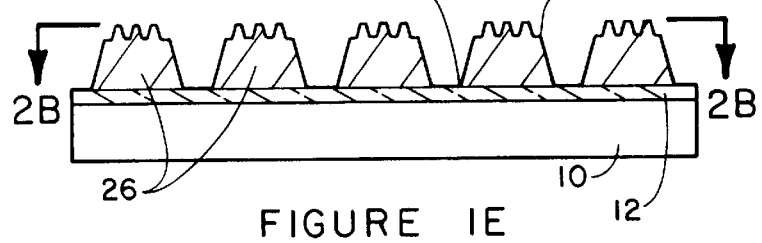
Figure 2B:
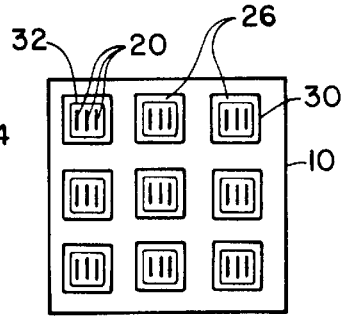
FIG. 2B is a schematic plan view taken along section line 2B—2B of FIG. 1E.
Figure 2C:
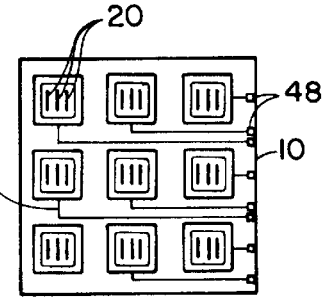
FIG. 2C is a schematic plan view taken along section line 2C—2C of FIG. 1F.
Figure 2D:
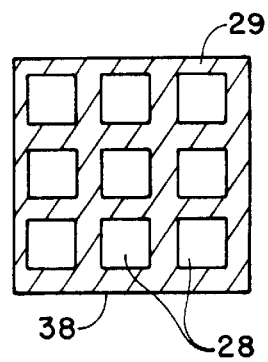
FIG. 2D is a schematic plan view taken along section line 2D—2D of FIG. 1E.

Next, as shown in FIG. 1E, the polymer layer 14 can be exposed through a reticle 38 and etched (i.e., developed) to form patterns of raised contact members 26. As shown in FIG. 2D, the reticle 38 includes open areas 28 and solid areas 29. With the polymer layer 14 comprising a negative tone resist, the unexposed areas of the polymer layer 14 (i.e., areas covered by the solid areas 29 of the reticle 38) will be removed by the etching step. The exposed areas of the polymer layer 14 (i.e., areas corresponding to the open areas 28 of the reticle 38) remain to form the contact members 26. In this case the open areas 28 correspond to the size and location of the contact members 26. With the polymer layer 14 comprising a positive tone resist, the exposed areas of the polymer layer 14 will be removed by the etching step. In this case the solid areas 29 correspond to the size and location of the contact members 26. Exposure of the polymer layer 14 can be with a conventional UV mask writer using a suitable UV dose. A representative UV dose for the previously described resist formulation is about 165 mJ/cm².

A suitable wet etchant for etching (i.e., developing) the previously described resist formulation is a solution of PGMEA (propyleneglycol-monomethylether-acetate). The etch process can be end pointed at the insulating layer 12. End pointing can be performed by monitoring the etch parameters including the etch rate and etch time.

The locations of the contact members 26 correspond to the locations of the contacts 22 (FIG. 3) on the semiconductor component 24 (FIG. 3). A height of the contact members 26 corresponds to a thickness of the polymer layer 14. A representative height of the contact members 26 measured from the insulating layer 12 to the tips of the projections 20 can be between about 3 to 10 mils. A width of the contact members 26 can be determined by the size of the openings 28 (FIG. 2D) in the reticle 38 (FIG. 2D). A representative width of each side of the contact members 26 can be from 1 to 5 mils. The sidewalls of the contact members 26 are almost vertical, but typically will form at an angle less than 90° as occurs with etch processes. As shown in FIG. 2B, a base portion 30 of the contact members 26 is larger than a tip portion 32 thereof. However, using the above described negative resist formulation the difference in size between the base portion 30 and tip portion 32 will be minimal.

Following etching of the polymer layer 14 to form the contact members 26, the remaining polymer material can be cured. A "full cure" can be performed with a hard bake at about 200° C. for about 30 minutes.

Figure 1F:
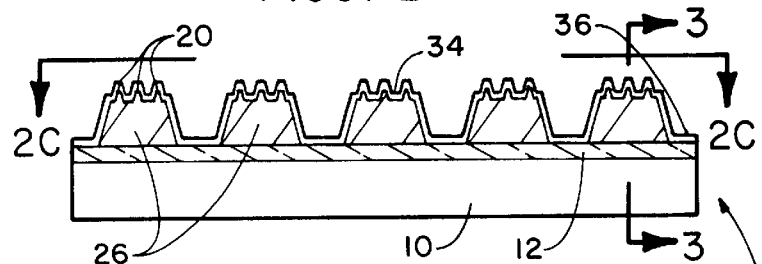

Next, as shown in FIG. 1F, conductive layers 34 can be formed on the contact members 26 and projections 20. The conductive layer 34 cover the contact members 26 to provide an electrically conductive surface for contacting the contacts 22 (FIG. 3) on the components 24 (FIG. 3). In addition, conductors 36 (FIG. 2C) can be formed on the substrate 10 in electrical communication with the conductive layers 34. The conductors 36 provide separate electrical paths to the conductive layers 34 for the contact member 26. The conductive layers 34 and conductors 36 can be formed of the same material using a same deposition process. Alternately, the conductive layers 34 and conductors 36 can be formed of different materials using separate deposition processes. Preferably, the conductors 36 include bonding pads 48 (FIG. 2C) that permit wire bonds or other electrical paths to be subsequently formed to the conductors 36.

Preferably the conductive layers 34 and conductors 36 are formed using a low temperature process to prevent softening of the contact members 26 and projections 20. For example, the conductive layers 34 and conductors 36 can be formed using an electroless deposition process, or an electrochemical deposition process. With electroless deposition, the contact members 26 and projections 20 can be activated by dipping in an activation solution. One suitable activation solution includes a zincate, such as $ZnO_2$ or $Zn(OH_4)$. Zincate solutions are commercially available from Lea Ronal, as well as other manufacturers. The activation solution can be applied to the contact members 26 and projections 20, and to desired areas of the substrate 10 wherein the conductors 36 will be located using a mask.

Following activation, the conductive layers 34 and conductors 36 can be electrolessly deposited on the contact members 26 and substrate 10 by dipping in a metal solution. Preferred metals include nickel, palladium and platinum. For depositing nickel, the metal solution can include nickel chloride, sodium hydroxyacetate, and sodium hypophosphate at a temperature of about 85 to 90° C. For depositing palladium the metal solution can include palladium chloride and sodium hypophosphate at a temperature of about 50° to 60° C.

A representative thickness for the conductive layers 34 and conductors 36 can be from about 500 Å to 10 μm. This thickness can be achieved by controlling the concentration of the metal solution and the time period during which the substrate 10 is submerged. A representative time period for a 6 gm/liter solution can be from one to five minutes.

Alternately in place of an electroless or electrochemical deposition processes, a metallization process can be used to form the conductive layers 34 and conductors 36. The metallization process can include blanket deposition of a thin film metal (e.g., CVD), followed by photopatterning and etching. The photopatterning step can include an electrolessly deposited layer of photoresist as disclosed in U.S. Pat. No. 5,607,818 entitled "Method For Making Interconnects And Semiconductor Structures Using Electrophoretic Photoresist Deposition", which is incorporated herein by reference.

The completed interconnect 46 shown in FIG. 1F includes the patterns of contact members 26 and conductors 36 formed on the substrate 10. As will be further explained, the interconnect 46 can be utilized in a die level test system for testing semiconductor components in the form of bare dice or chip scale packages. The interconnect 46 can also be used in a wafer level test system for testing dice or chip scale packages contained on semiconductors wafers.

Referring to FIG. 3, an individual contact member 26 of the interconnect 46 is shown electrically engaging a corresponding contact 22 on the semiconductor component 24. In this case the component 24 comprises a bare semiconductor die and the contact 22 comprises a thin film aluminum bond pad embedded in a passivation layer 42. The contact member 26 maintains a gap 40 between the component 24 and the substrate 10 for the interconnect 46. The size (i.e., width) of the gap 40 is equal to the height of the contact member 26. The gap 40 helps to prevent shorting due to surface contaminants on the component 24 and substrate 10. In addition, the gap 40 helps to prevent cross talk between the conductors 36 and conductive traces on the component 24.

As also shown in FIG. 3, the projections 20 on the contact member 26 penetrate into the contacts 22 on the component 24. The penetration is through native oxide layers so that a low resistance electrical connection is formed between the conductive layers 34 of the contact member 26 and the underlying metal of the contacts 22. However, damage to the contacts 22 is minimized because penetration into the contacts 22 is limited by the tip portions 32 of the contact members 26 providing a stop plane. Also the projections 20 are dimensioned to not completely penetrate the contacts 22.

Figure 3A:
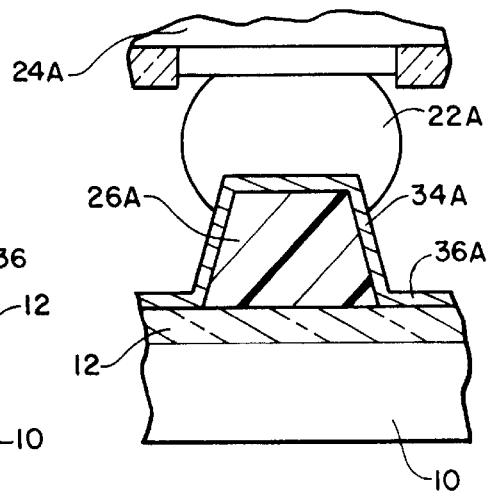
FIG. 3A is an enlarged schematic cross sectional view equivalent to FIG. 3 of an alternate embodiment contact member in electrical communication with a bumped contact.

Referring to FIG. 3A, an alternate embodiment contact member 26A is illustrated. Contact member 26A is substantially similar to the contact members 26 previously described but does not include projections 20. The contact member 26A includes a conductive layer 34A and a conductor 36A formed on the substrate 10 and insulating layer 12 substantially as previously described. In this embodiment the contact member 26A is designed to penetrate a bumped contact 22A of a bumped semiconductor component 24A. By way of example, the bumped semiconductor component 24A can comprise a bumped die, or a chip scale package having bumped contacts 22A in a particular pattern or array (e.g., BGA, FBGA).

Figure 3B:
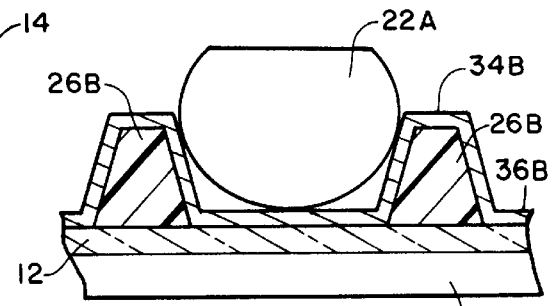
FIG. 3B is an enlarged schematic cross sectional view equivalent to FIG. 3 of another alternate embodiment contact member in electrical communication with a bumped contact.

Referring to FIG. 3B, alternate embodiment contact members 26A are illustrated. Contact members 26A are substantially similar to the contact members 26A previously described but do not include projections 20. In this embodiment two or more contact members 26A are grouped in a spaced array dimensioned to retain the bumped contact 22A therebetween. The contact members 26 include conductive layers 34A and conductors 36A formed substantially as previously described.

Figure 4A:
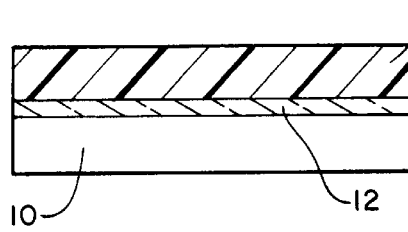
FIGS. 4A–4C are schematic cross sectional views illustrating process steps for fabricating another alternate embodiment contact member in accordance with the invention.
Figure 4B:
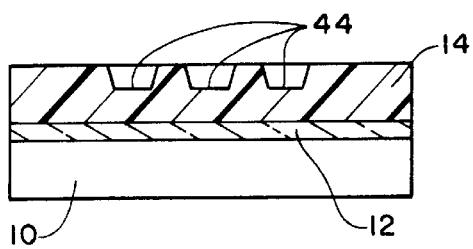
Figure 4C:
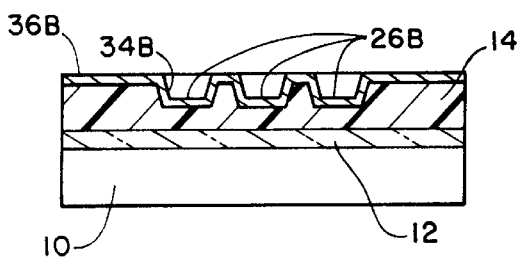

Referring to FIGS. 4A–4C, steps in a method for fabricating another alternate embodiment contact member 26B (FIG. 4C) are illustrated. Initially, as shown in FIG. 4A, the substrate 10, the insulating layer 12, and the polymer layer 14 can be formed substantially as previously described.

Next, as shown in FIG. 4B, indentations 44 are formed in the polymer layer 14. The indentations 44 can be formed by patterning the polymer layer 14 by exposure with a conventional UV mask writer using a reticle (not shown) as previously described for reticle 38 (FIG. 1E). Following exposure the polymer layer 14 can be etched substantially as previously described to form the indentations 44. A peripheral shape of the indentations 44 will be determined by the reticle. A depth of the indentations 44 will be determined by the endpoint of the etch process.

Figure 5:
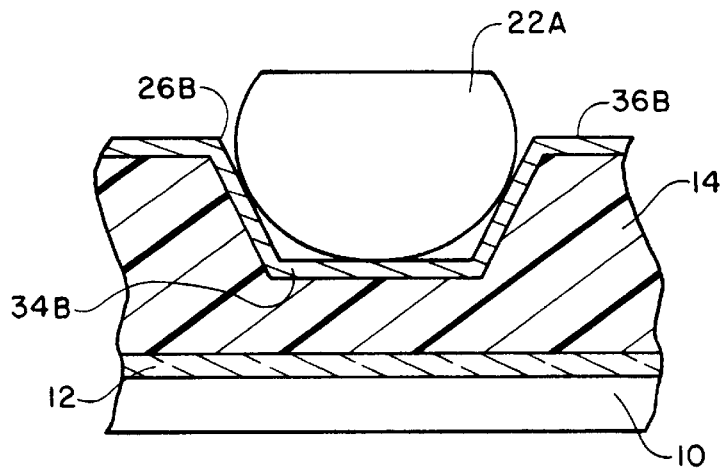
FIG. 5 is an enlarged schematic cross sectional view equivalent to FIG. 3 of the alternate embodiment contact member of FIGS. 4A–4C in electrical communication with a bumped contact.

The indentations 44 are sized and shaped to retain the bumped contacts 22A (FIG. 5). As such, the indentations 44 can be formed with a diameter that is slightly less than a diameter of the bumped contacts 22A. For example, for retaining bumped contacts having a diameter of 5 mils, the indentations 44 can have a diameter of 3–5 mils. In addition, the indentations 44 can be formed with a selected depth (e.g., 1–5 mils) and a selected shape (e.g., circular, square, rectangular, elongated rectangular, circular or oval shaped).

Following formation of the indentations 44, and as shown in FIG. 4C, conductive layers 34B and conductors 36B can be formed substantially as previously described for conductive layers 34 (FIG. 3) and conductors 36 (FIG. 3). As shown in FIG. 5, the completed contact members 26B are adapted to retain the bumped contacts 22A. In addition, the conductive layers 34B electrically engages the bumped contacts 22A and the conductors 36B provide separate electrical paths to the conductive layers 34B.

Figure 5A:
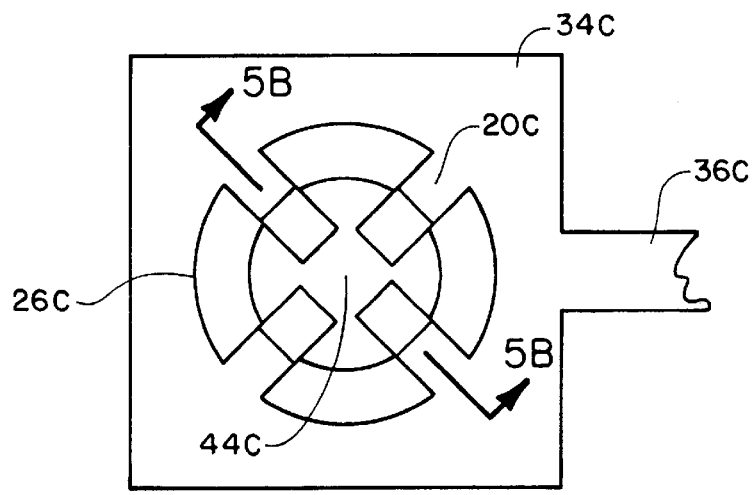
FIG. 5A is a schematic plan view of an alternate embodiment contact member equivalent to the contact member of FIG. 5 but including penetrating projections.
Figure 5B:
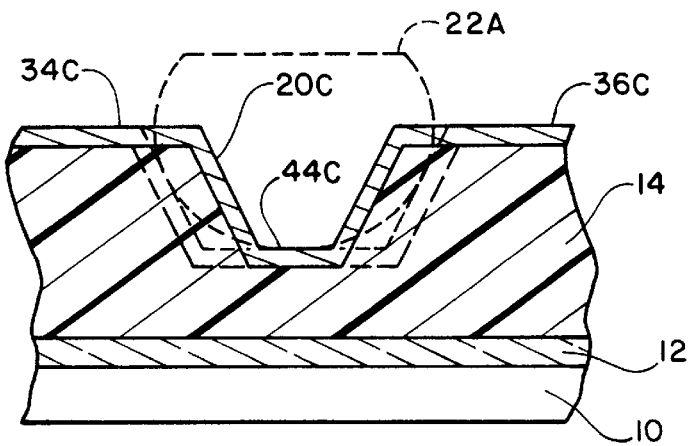
FIG. 5B is a cross sectional view taken along section line 5B—5B of FIG. 5A.

Referring to FIGS. 5A and 5B, an alternate embodiment contact member 26C includes an indentation 44C for retaining the bumped contact 22A. The indentation 44C can be formed in the polymer layer 14 substantially as previously described for indentation 26B (FIG. 5). The contact member 26C also includes penetrating projections 20C formed in the polymer layer 14. The penetrating projections 20C extend into the indentation 26B, and are adapted to penetrate the bumped contact 22A, as it is retained in the indentation 44C. In the embodiment illustrated in FIGS. 5A and 5B, there are four penetrating projections 20C per contact member 26C. The penetrating projections 20C are formed at right angles to one another. Alternately, a greater or lesser number of penetrating projections 20C can be formed in a desired pattern. The penetrating projections 20C can be formed at the same time as the indentation 44C by exposing and etching the polymer layer 14. A reticle similar to the reticle 38 (FIG. 2D) can be employed for the developing step. In addition, a conductive layer 34C and conductor 36C can be formed substantially as previously described for conductive layers 34 (FIG. 3) and conductors 36 (FIG. 3).

Die Level Test System

Figure 6A:
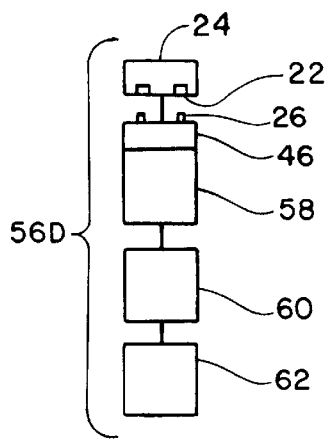
FIG. 6A is a block diagram of a die level test system constructed in accordance with the invention.
Figure 6B:
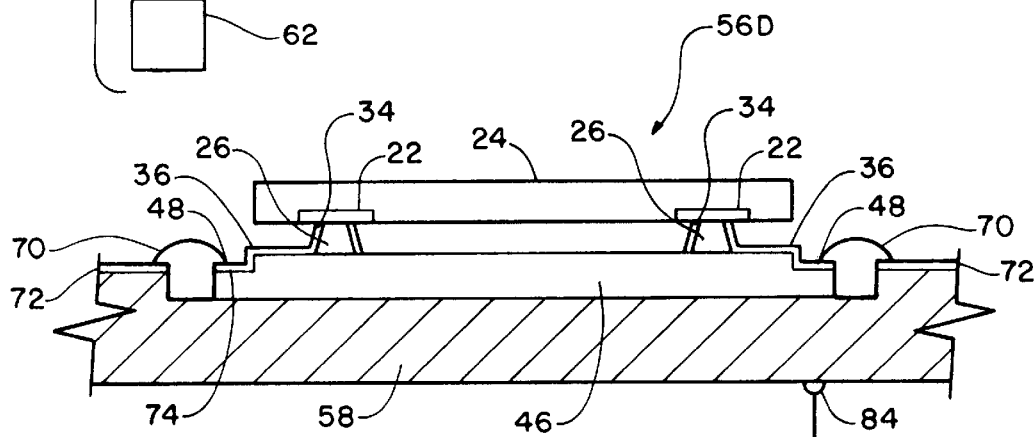
FIG. 6B is a schematic cross sectional view of the die level test system.

Referring to FIGS. 6A and 6B, a die level test system 56D employing the interconnect 46 is illustrated. The die level test system 56D can be used to test the components 24 (FIG. 3) or 24A (FIG. 3A) previously described. However, testing of the components 24 with planar contacts 22 is illustrated. The die level test system 56D includes the interconnect 46 mounted to a test carrier 58. The test carrier 58 is configured to contain one or more components 24 for testing. In addition, the test carrier 58 is electrically connectable to a burn-in board 60 in electrical communication with test circuitry 62. The test carrier 58 can be constructed as disclosed in U.S. Pat. No. 5,519,332; U.S. Pat. No. 5,541,525; U.S. Pat. No. 5,495,179; or U.S. Pat. No. 5,302,891, which are incorporated by reference.

As shown in FIG. 6B, the interconnect 46 can be electrically connected to the test carrier 58 by wire bonds 70. The wire bonds 70 can be bonded to the bonding pads 48 on the interconnect 10, and to corresponding bonding pads 72 on the test carrier 58. The interconnect 46 can also include a stepped edge 74 to provide clearance for the wire bonds 70. The test carrier 58 can include external contacts 84, such as electrical pins, that are in electrical communication with the bonding pads 72 and electrically connectable to the burn-in board 60 and test circuitry 62.

The test carrier 58 can also include a biasing mechanism (not shown) for biasing the component 24 against the interconnect 46. The test circuitry 62 is adapted to transmit test signals to the integrated circuits on the component 24 and to analyze the resultant signals. Suitable test circuitry 62 is commercially available from Teradyne, Advantest, and Hewlett-Packard. The burn-in board 60 can also be in the form of a conventional burn-in board.

Wafer Level Test System

Figure 7A:
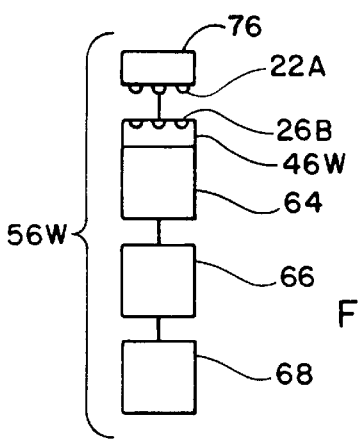
FIG. 7A is a block diagram of a wafer level test system constructed in accordance with the invention.
Figure 7B:
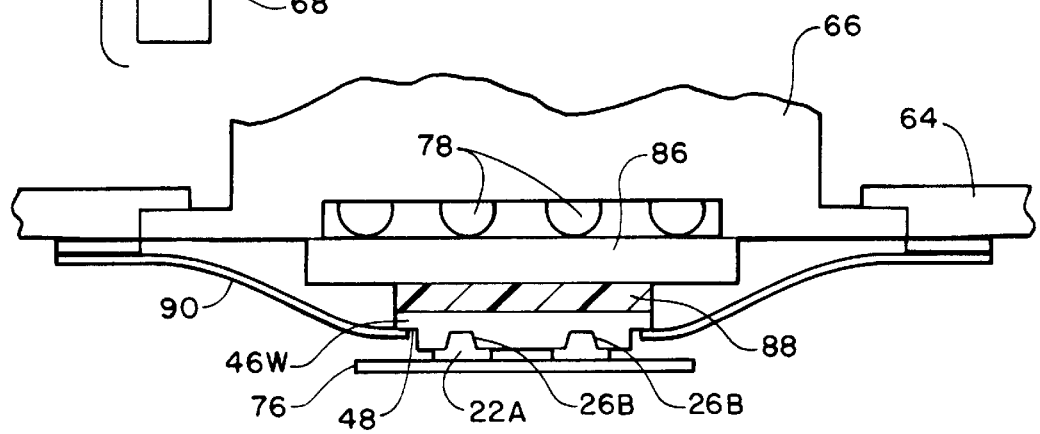
FIG. 7B is a schematic cross sectional view of the wafer level test system.

Referring to FIGS. 7A and 7B, a wafer level test system 56W employing a wafer level interconnect 46W is illustrated. The wafer level interconnect 46W can be constructed substantially as previously described for interconnect 46 but sized for testing a semiconductor wafer 76 or portion thereof. The wafer level interconnect 46W includes contact members 26B as previously described in electrical communication with bonding pads 48. The contact members 26B can be configured to electrically connect to bumped contacts 22A on the wafer 76. The wafer level interconnect 46W and contact members 26B can be configured to simultaneously test all of the dice on the wafer 76, or alternately a desired number of dice on the wafer 76.

In addition to the wafer level interconnect 46W, the wafer level test system 56W includes a testing apparatus 66 in electrical communication with testing circuitry 68. The testing apparatus 66 can be a conventional wafer probe handler, or probe tester, modified for use with the interconnect 46W. Wafer probe handlers and associated test equipment are commercially available from Electroglass, Advantest, Teradyne, Megatest, Hewlett-Packard and others. In this system 56W, the interconnect 46W takes the place of a conventional probe card and mounts to a probe card fixture 64 of the testing apparatus 66.

With interconnect 46w mounted to the testing apparatus 66, the testing apparatus 66 can be used to step the wafer 76, or to step the interconnect 46W, so that the dice on the wafer 76 can be tested in groups until all of the dice on the wafer 76 have been tested. Alternately, the contact members 26B can be configured to contact every bumped contact 22A for all of the dice on the wafer 76 at the same time. Test signals can then be selectively applied and electronically switched as required, to selected dice on the wafer 76.

As shown in FIG. 9B, the interconnect 46W can mount to the probe card fixture 64 of the testing apparatus 66. The probe card fixture 64 can be similar in construction to a conventional probe card fixture commercially available from manufacturers such as Packard Hughes Interconnect and Wentworth Laboratories. The probe card fixture 64 can be formed of an electrically insulating material such as FR-4 or ceramic. In addition, the testing apparatus 66 can include a force applying mechanism 78 associated with the probe card fixture 64.

The interconnect 46W can be mounted to a mounting plate 86 in contact with the force applying mechanism 78. The force applying mechanism 78 can be spring loaded pins or equivalent elements. In addition, a biasing member 88 formed of an elastomeric material, or as a fluid or gas filled bladder, can be mounted between the mounting plate 86 and interconnect 46W.

Still further, conductive paths 90 can be formed from the probe card fixture 64 to the interconnect 46W. By way of example, the conductive paths 90 can comprise multi layered tape with laminated conductors similar to TAB tape, or ASMAT manufactured by Nitto, Denko. Bonded connections can be formed to the bonding pads 48 on the interconnect 46W.

Further details of a wafer level test system similar to test system 46W are contained in U.S. Patent Application Ser. No. 08/797,719, filed Feb. 11, 1997, entitled "PROBE CARD FOR SEMICONDUCTOR WAFERS AND METHOD AND SYSTEM FOR TESTING WAFERS" which is incorporated herein by reference.

While the invention has been described with reference to certain preferred embodiments, as will be apparent to those skilled in the art, certain changes and modifications can be made without departing from the scope of the invention as defined by the following claims.

What is claimed is:

1. A method for fabricating an interconnect for a semiconductor component having a contact comprising:

providing a substrate;

providing a resist configured to form features with an aspect ratio (height/width) of at least 10;

depositing the resist on the substrate to form a polymer layer;

exposing, etching, and curing the polymer layer to form a raised contact member on the substrate; and forming a conductive layer on the contact member configured to electrically engage the contact on the component.

2. The method of claim 1 wherein a height of the polymer layer and the contact member is about 3 mils to 10 mils.

3. The method of claim 1 wherein the resist comprises an epoxy, a solvent and a photoinitiator.

4. The method of claim 1 further comprising forming a projection in the polymer layer prior to etching such that the contact member includes the projection for penetrating the contact on the component.

5. A method for fabricating an interconnect for a semiconductor component having a bumped contact comprising:

providing a substrate;

providing a resist configured to form features with an aspect ratio (height/width) of at least 10;

depositing the resist on the substrate to form a polymer layer;

exposing and etching the polymer layer to form an indentation configured to retain the bumped contact on the component;

curing the polymer layer; and depositing a conductive layer in the indentations.

6. The method of claim 5 wherein the indentation has a death of about 1–5 mils.

7. The method of claim 5 wherein the resist comprises an epoxy, a solvent and a photoinitiator.

8. The method of claim 5 further comprising forming at least one projection in the indentation for penetrating the bumped contact on the component by exposing and etching the polymer layer.

9. A method for fabricating an interconnect for a semiconductor component having a plurality of contacts comprising:

providing a substrate;

providing a resist configured to form features having an aspect ratio (height/width) of at least 10;

depositing the resist on the substrate to form a resist layer with a thickness of about 3 to 10 mils;

exposing the resist layer through openings in a reticle;

etching the resist layer to remove either exposed or unexposed portion of the resist layer to form a plurality of raised contact members corresponding to a pattern of the contacts on the component and having a height corresponding to the thickness; and forming a conductive layer on each contact member.

10. The method of claim 9 wherein the resist comprises an epoxy, a solvent and a photoinitiator.

11. The method of claim 9 wherein forming the conductive layer comprises an electroless or electrochemical deposition process.

12. The method of claim 9 further comprising forming an insulating layer on the substrate prior to the depositing step and endpointing the etching step on the insulating layer.

13. A method for fabricating an interconnect for a semiconductor component having a bumped contact comprising:

providing a substrate;

providing a resist configured to form features having an aspect ratio (height/width) of at least 10;

depositing the resist on the substrate to form a resist layer;

etching the resist layer to form an indentation therein configured to retain the bumped contact and having a depth of about 1–5 mils;

depositing a conductive layer within the indentation configured to electrically engage the bumped contact; and forming a conductor on the substrate in electrical communication with the conductive layer.

14. The method of claim 13 wherein the resist comprises an epoxy, a solvent and a photoinitiator.

15. The method of claim 13 wherein the substrate comprises a material selected from the group consisting of ceramic, mullite and silicon.

16. The method of claim 13 wherein the conductive layer comprises a material selected from the group consisting of nickel, palladium and platinum.

17. A method for fabricating an interconnect for a semiconductor component having a contact comprising:

providing a substrate;

providing a resist comprising epoxy and a photoinitiator;

depositing the resist on the substrate to form a resist layer having a thickness;

exposing the resist layer through a reticle;

etching the resist layer to form a contact member on the substrate having a height equal to the thickness; and depositing a conductive layer on the contact member configured to electrically engage the contact on the component.

18. The method of claim 17 further comprising forming an insulating layer on the substrate and endpointing the etching step on the insulating layer.

19. The method of claim 17 further comprising forming a projection in the resist layer prior to the etching step such that the contact member includes the projection for penetrating the contact on the component.

20. A method for fabricating an interconnect for a semiconductor component having a bumped contact comprising:

providing a substrate;

providing a resist comprising epoxy and a photoinitiator;

depositing the resist on the substrate to form a resist layer;

exposing the resist layer through a reticle;

etching the resist layer to form an indentation therein sized to retain the bumped contact on the component and a projection in the indentation configured to penetrate the bumped contact; and depositing a conductive layer in the indentation conzfigured to electrically engage the bumped contact.

21. The method of claim 20 wherein the resist is formulated to form features having an aspect ratio (height/width) of at least 10.

* * * * *

UNITED STATES PATENT AND TRADEMARK OFFICE
CERTIFICATE OF CORRECTION

PATENT NO : 6,130,148
DATED : October 10, 2000
INVENTOR(S): WARREN M. FARNWORTH, SALMAN AKRAM It is certified that error appears in the above-identified patent and that said Letters Patent are hereby corrected as shown below:

In claim 5 @ column 9, line 42, change "indentations" to ---indentation---.

In claim 6 @ column 9, line 45, change "death" to ---depth---.

Signed and Sealed this

Twenty-fourth Day of April, 2001

Attest:

NICHOLAS P. GODICI

*Attesting Officer*    *Acting Director of the United States Patent and Trademark Office*